United States Patent [19]

Bargain et al.

[11] Patent Number: 5,437,556
[45] Date of Patent: Aug. 1, 1995

[54] INTERMEDIATE CONNECTOR FOR USE BETWEEN A PRINTED CIRCUIT CARD AND A SUBSTRATE FOR ELECTRONIC CIRCUITS

[75] Inventors: Raymond Bargain, Sartrouville; Jean Riverie, Limours; Jean-François Ollivier, Versailles, all of France

[73] Assignee: Framatome Connectors International, Courbevoie, France

[21] Appl. No.: 225,730

[22] Filed: Apr. 11, 1994

[30] Foreign Application Priority Data

Apr. 9, 1993 [FR] France .................................. 93 04264

[51] Int. Cl.⁶ .............................................. H01R 23/72
[52] U.S. Cl. .......................................... 439/66; 439/71
[58] Field of Search ............................ 439/66, 71, 73

[56] References Cited

U.S. PATENT DOCUMENTS

| | | | |
|---|---|---|---|
| 4,268,102 | 5/1981 | Grabbe . | |
| 4,511,197 | 4/1985 | Grabbe et al. . | |
| 4,684,184 | 8/1987 | Grabbe et al. . | |
| 4,995,817 | 2/1991 | Grabbe | 439/71 OR |
| 5,018,981 | 5/1991 | Matsuoka | 439/71 OR |
| 5,067,904 | 11/1991 | Takeuchi et al. | 439/73 OR |
| 5,152,694 | 10/1992 | Bargain | 439/66 OR |
| 5,199,889 | 4/1993 | McDevitt, Jr. | 439/71 X |
| 5,395,252 | 3/1995 | White | 439/66 OR |

Primary Examiner—Larry I. Schwartz
Assistant Examiner—Daniel Wittels
Attorney, Agent, or Firm—Pollock, Vande Sande & Priddy

[57] ABSTRACT

An intermediate connector is for mounting on a printed circuit card so that a first face of the connector bears against the card, and so that a second face thereof receives a substrate of an electronic circuit. It interconnects contact areas provided on the substrate and tracks on the card. The connector has an insulating support having regularly spaced apart through-passages that receive respective electrical signal contacts, each of which connects one contact area to a track. Each contact is a cut out piece of metal sheet and has a rigid branch for fastening it to the support, and a flexible branch that is S-shaped. Each passage is defined by partitions and slidably receives a corresponding rigid branch and it has abutment shoulders that are spaced apart by an interval eo, The abutment closest to the first face is at a predetermined height ho relative thereto. The rigid branch extending along the passage has two mutually facing abutment shoulders that are spaced apart by a determined interval eo greater than e. The contact projects a distance h from the shoulder closest to the second face and h is less than ho.

5 Claims, 1 Drawing Sheet

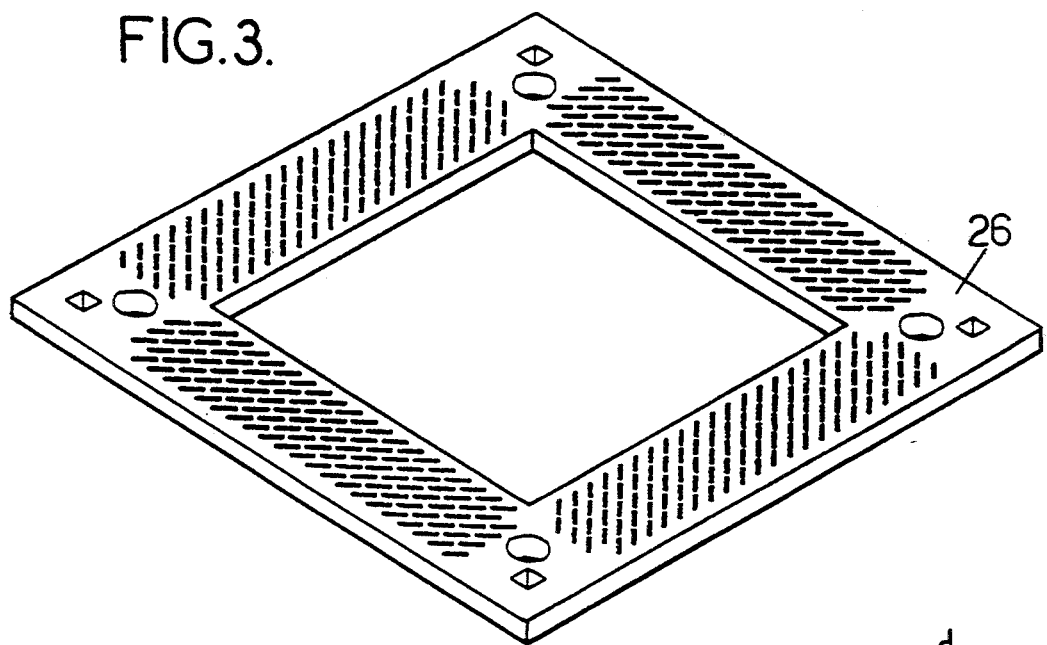
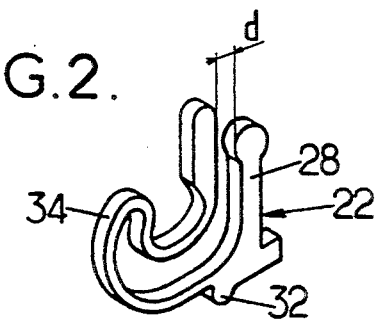
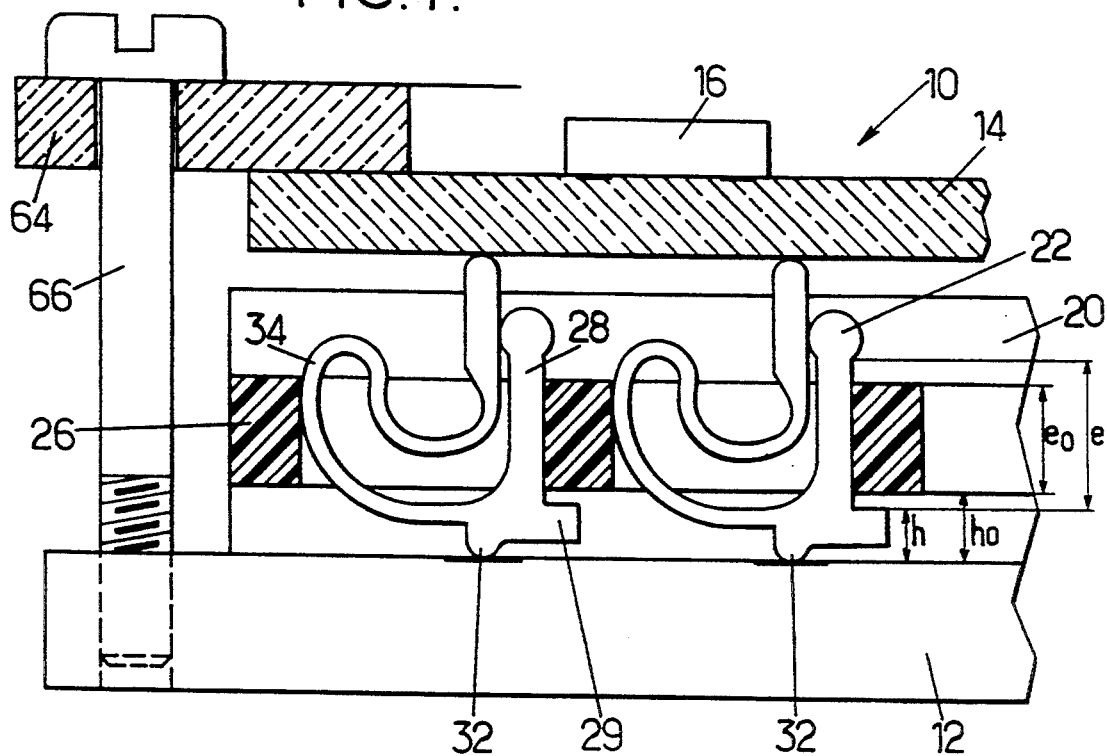

INTERMEDIATE CONNECTOR FOR USE BETWEEN A PRINTED CIRCUIT CARD AND A SUBSTRATE FOR ELECTRONIC CIRCUITS

BACKGROUND OF THE INVENTION

The present invention relates to an intermediate connector for use between a printed circuit card and a substrate carrying electronic circuits. A particularly important, although not exclusive application lies in devices having a ceramic substrate and in particular a substrate carrying a plurality of integrated circuits.

The invention relates more particularly to an intermediate connector of the kind described in French patent FR 90 13996, designed to be mounted on a printed circuit card in such a manner that a first face of the connector bears against the card, and to receive, via a second face, an electronic substrate, while interconnecting contact areas provided on the surface of the substrate that faces the card and tracks on the card, said connector comprising:

an insulating support in which regularly spaced passages are formed; and electrical signal contacts, each designed to connect one contact area to a respective track, received in at least some of the passages, in which at least some of the contacts are each made as a cut out metal sheet part, each of said contacts having a rigid branch for securing it to the support and an S-shaped flexible branch whose proximal end is fast with the rigid branch and whose distal end projects beyond the top face of the support, the flexible branch being curved at rest in such a manner that its distal end is then spaced from the rigid branch and the contact-receiving passage has dimensions such that it deforms the flexible branch on insertion of the contact into the support so as to bring the distal portion into contact with the rigid branch, thereby constituting a short circuit.

One of the problems in implementing such connectors is obtaining uniform stresses on the contacts when the connector is mounted between a card and a substrate.

SUMMARY OF THE INVENTION

An object of the invention is to provide a connector of the kind defined above that is better at satisfying practical requirements than are previously known connectors, and in particular that ensures uniformity of pressure, as is desirable. Consequently, the invention proposes a connector of the above-defined type, wherein the passage is defined by a partition slidably receiving the rigid branch and having abutment shoulders that are spaced apart by a determined interval eo, the abutment shoulder closest to the first face of the connector being at a first predetermined height hO therefrom;

the rigid securing branch that extends along the passage includes two mutually facing abutment shoulders that are spaced apart by a determined interval e, greater than eo; and the distance through which the contact projects from the shoulder closest to the second face is less than ho.

In this disposition, each of the contacts takes up position automatically in such a manner that the pressures exerted on each side on the contact balance and the pressure forces that act on the various contacts also come into balance.

The invention also provides other dispositions that are advantageously usable with the above dispositions but that may be used independently. All of these dispositions will appear more clearly on reading the following description of a particular embodiment, given by way of examples. The description refers to the accompanying drawings.

BRIEF DESCRIPTION OF THE DRAWINGS

FIG. 1 is a cross-sectional view showing a fraction of a connector constituting a particular embodiment of the invention together with the elements that are associated therewith and that are concerned by the invention;

FIG. 2 is a detailed view in perspective and on a larger showing one of the contacts of the connector of FIG. 1 in free condition; and FIG. 3 is a perspective view of an insulating support for a connector, suitable for implementing the invention.

DETAILED DESCRIPTION

The connector 10 shown in FIG. 1 has a structure that is generally similar to that described in French patent No. 90 13996, to which reference may be made. It is designated to be mounted on a printed circuit card 12 that is to be connected to a substrate 14 for active electronic circuits. The substrate may be constituted, in particular, by a multi-layer ceramic plate (optionally surmounted by thin film structures) that is designed to receive integrated circuit chips 16. However, the invention is also applicable when the substrate is designed to receive a single integrated circuit and/or is made of a material other than ceramic (e.g. organic material).

The connector includes an insulating support 20. In the example shown in FIG. 3, the support is in the form of a frame.

Through passages are formed in the insulating support 20 and they are aligned in rows. They are sized to receive respective contacts that may be of various different kinds. The contacts 22 shown in FIGS. 1 and 2 are intended to transmit signals. Other contacts may be for setting up equipotential connections, e.g. ground or power supply connections.

Each contact 22 (FIG.2) is generally cut out from a sheet or foil of a conductive material that has good resiliency, e.g. beryllium bronze. It may be considered as having a relatively rigid branch 28 for fastening to the support and a relatively flexible branch 34 for making electrical contact.

Each contact-receiving passage is laterally defined by two partitions 26 that do not occupy the full height of the insulating support 20. These partitions, which are all of the same height, form pairs of abutment shoulders that are spaced apart by a predetermined interval eo. When the insulating support is mounted on the card 12, each shoulder closest to the first face of the support, i.e. that face which bears against the card 12, is at a height ho from said card 12.

The rigid branch 28 of each contact extends along a respective passage and also includes two mutually facing abutment shoulders that are spaced apart by a predetermined interval e that is slightly greater than eo (e.g. 1.1 to 1.4 times eo), thereby allowing the contact to "float" in the passage.

In the embodiment shown in FIGS. 1 and 2, the abutment shoulder closest to the first face of the support is constituted by a stump 29 extending transversely to the direction of the rigid branch 28. The other shoulder is constituted by the root of a swelling 22 having a rounded shape to prevent the contact jamming when it is being inserted into a passage.

In immediate proximity to its connection with the flexible branch, the rigid branch has a swelling 32 for abutment against a track of the card 12 (and optionally for being soldered thereto). The distance h between the shoulder closest to the first face and the end of the swelling 32 is less than ho. For example, h may lie in the range 0.6 ho to 0.9 ho.

The flexible branch 34 is generally S-shaped. Its proximal end merges with the rigid securing branch 38, close to the swelling 32.

The shape of the contact 22 at rest, as shown in FIG. 2, is such that the distal end of the flexible branch is laterally offset by a distance d from the top end of the rigid securing branch 28. On the other hand, the transverse size of the contact-receiving passages formed through the support 20 is such that the pressure exerted by the sides of the passage cause the flexible branch 34 to take up the shape shown in FIG. 1, i.e. to come into contact with the fastening branch 28. Nevertheless, it is not essential that this condition be satisfied. The shape of the flexible portion 34 is also such that the pressure exerted by the substrate 14, when forced into contact with the support 20, advantageously brings that the last bend of the flexible branch into contact with the proximal end of the same branch. This establishes a short circuit, thereby reducing signal transit time.

In the example shown in FIG. 1, means for forcing the substrate 14 against the support 20 comprise a movable assembly having a pressure plate 64 and screws 66. A spring is typically interposed between each screw and the plate 64.

Since the distance h is less than ho, the danger of exerting a pressure force on the stump 29 is avoided. Since e is greater than eo, the position of the rigid branch 28 of each contact adapts automatically so that the force exerted by the flexible branch 34 on the rigid branch exactly balances the reaction force exerted on the swelling 32. This serves to reduce the stresses to which the contacts are subjected and to balance the stresses over the connector as a whole.

A contact force is thus guaranteed both on the substrate and on the printed circuit, in spite of dimensional variations in the distance between the substrate and the printed circuit as may arise particularly—but not exclusively—because of inaccuracies of planeness.

I claim:

1. An intermediate connector intended to be mounted on a printed circuit card with a first face of the connector in contact with the card and to receive an electronic substrate on a second face thereof, said connector for interconnecting contact areas provided on a surface of the substrate which confronts the card and tracks on the card, said connector comprising:
    an insulating support in which regularly spaced passages are formed; and
    a plurality of electrical signal contacts, each to connect a contact area to a track, and each disposed in one of at least some of the passages,
    wherein at least some of the contacts are each constituted by a cut out piece of metal sheet and each having a rigid fastening branch for securing it to the support and an S-shaped flexible branch whose proximal end merges with the rigid branch and whose distal end projects beyond an upper face of the support, the flexible branch having such curvatives at rest that said distal end is then offset from the rigid branch and wherein each said passage has dimensions such that, on insertion of the contact into the passage, said passage deforms the flexible branch and brings a distal end portion thereof into electrical connection with the rigid branch, thereby constituting a short circuit,
    wherein each said passage is defined by a partition slidably receiving said rigid branch and having abutment shoulders that are spaced apart by a determined interval eo, the abutment shoulder closest to the first face of the connector being at a first predetermined height ho therefrom;
    wherein the rigid securing branch extends along the passage includes two mutually facing abutment shoulders that are spaced apart by a determined interval e greater than the determined interval eo; and
    wherein the distance h through which the contact projects from the shoulder of said rigid fastening branch which is closest to the second face is less than ho.

2. A connector according to claim 1, wherein the abutment shoulder of said rigid branch closest to the first face of the support formed on a stump extending transversely to the direction of the rigid branch and the other shoulder of said rigid branch is constituted by the beginning of a terminal swelling of the contact.

3. A connector according to claim 1, wherein the flexible branch merges with the rigid branch in the proximity of a thrust swelling of the contact arranged for abutment against the printed circuit card.

4. A connector according to claim 1, wherein the interval e between the two abutment shoulders of the rigid branch lies in the range 1.1 to 1.4 times the interval eo.

5. A connector according to claim 1, wherein the amount of projection (h) lies in the range 0.6 to 0.9 times said predetermined height (ho).

* * * * *